(12) United States Patent
Yoshikawa et al.

(10) Patent No.: US 7,608,828 B2
(45) Date of Patent: Oct. 27, 2009

(54) SOLID SOLUTION MATERIAL OF RARE EARTH ELEMENT FLUORIDE (POLYCRYSTAL AND SINGLE CRYSTAL), AND METHOD FOR PREPARATION THEREOF, AND RADIATION DETECTOR AND TEST DEVICE

(75) Inventors: Akira Yoshikawa, Miyagi (JP); Kenji Aoki, Osaka (JP); Tomohiko Satonaga, Osaka (JP); Kei Kamada, Miyagi (JP); Tsuguo Fukuda, Miyagi (JP)

(73) Assignees: Stella Chemifa Corporation, Osaka (JP); Tohoku Techno Arch Co., Ltd., Sendai-Shi (JP)

( * ) Notice: Subject to any disclaimer, the term of this patent is extended or adjusted under 35 U.S.C. 154(b) by 0 days.

(21) Appl. No.: 11/578,248

(22) PCT Filed: Apr. 12, 2005

(86) PCT No.: PCT/JP2005/007068

§ 371 (c)(1),
(2), (4) Date: Mar. 6, 2007

(87) PCT Pub. No.: WO2005/100645

PCT Pub. Date: Oct. 27, 2005

(65) Prior Publication Data
US 2007/0272898 A1 Nov. 29, 2007

(30) Foreign Application Priority Data
Apr. 12, 2004 (JP) ............................. 2004-117131
Aug. 25, 2004 (JP) ............................. 2004-245269

(51) Int. Cl.
*G01T 1/20* (2006.01)
(52) U.S. Cl. ................................................. 250/361 R

(58) Field of Classification Search ............. 250/361 R; 252/301.4 H
See application file for complete search history.

(56) References Cited

U.S. PATENT DOCUMENTS
3,640,887 A * 2/1972 Anderson ................... 252/625
(Continued)

FOREIGN PATENT DOCUMENTS
JP 2002-214347 7/2002
(Continued)

OTHER PUBLICATIONS

G. Blasse et al., The Gd3+ Luminescence of the Solid Solutions Y2-xGdxO2S and Y1-xGdxF3, Chemical Physics Letters, 1989, vol. 164, No. 6, pp. 617 to 620.
(Continued)

*Primary Examiner*—David P Porta
*Assistant Examiner*—Kiho Kim
(74) *Attorney, Agent, or Firm*—Young & Thompson

(57) ABSTRACT

A rare earth fluoride solid solution material (polycrystal and/or single crystal) characterized in that the material is obtained by mutually combining a plurality of rare earth fluorides having phase transitions and having different ion radii, respectively, so that the rare earth fluoride solid solution material is free of phase transitions. A rare earth fluoride solid solution material (polycrystal and/or single crystal) characterized in that the material is represented by $(RE_y RE'_{1-y})F_3$ ($0.0000 < y < 1.0000$), wherein RE represents one or more selected from Sm, Eu, and Gd, and RE' represents one or two or more selected from Er, Tm, Yb, Lu, and Y. A rare earth fluoride solid solution material (polycrystal and/or single crystal) represented by $M_x RE_y RE'_{1-x-y} F_z$, wherein RE is one or two or more selected from Ce, Pr, Nd, Eu, Tb, Ho, Er, Tm, or Yb, RE' is one or two or more selected from La, Sm, Gd, Dy, Lu, Y, and Sc, and M is one or more of Mg, Ca, Sr, and Ba.

27 Claims, 6 Drawing Sheets

U.S. PATENT DOCUMENTS

| | | | |
|---|---|---|---|
| 4,042,527 A | * | 8/1977 | Kano et al. ............ 252/301.4 H |
| 4,749,513 A | | 6/1988 | Collins et al. |
| 5,653,830 A | * | 8/1997 | Fleig et al. .................... 156/67 |
| 2001/0020696 A1 | * | 9/2001 | Srivastava et al. .......... 252/79.1 |

FOREIGN PATENT DOCUMENTS

| | | |
|---|---|---|
| JP | 2003-222676 | 8/2003 |
| WO | 97/14059 | 4/1997 |
| WO | 03/001242 | 1/2003 |

OTHER PUBLICATIONS

V. Trnovcova et al., Sructural aspects of fast ionic conductivity of rare earth fluorides, Solid State Ionics, 2003, vol. 157, pp. 195-201.

M. Kobayashi et al., Scintillation characteristics of nonstoichiometric phases fromed in MF2-GdF3-CeF3 system Part I. (M=Ba), Nuclear Instruments and Methods in Physics Research A, 1999, vol. 421, pp. 180 to 190.

M. Kobayashi et al., Scintillation characteristics of nonstoichiometric phases fromed in MF2-GdF3-CeF3 system Part III, Nuclear Instruments and Methods in Physics Research A, 1999, vol. 421, pp. 199 to 210.

K. Ishii et al., Improvement of Time Resolution in a TOF PET System With the Use of BaF2 Crystals, Nuclear Instruments and Methods in Physics Research A, 1986, vol. 253, pp. 128 to 134.

Akira Yoshikawa et al., "Scintillator Oyo Ce: ( Cd, Y) F3 Tankessho no Sakusei Oyobi Sono Hyoka", Dai 65 Kai Extended abstracts; the Japan Society of Applied Physics, 2004.9, separated col. 1, p. 237, 3p-T-8.

Akira Yoshikawa et al., "Ce; ( Gd, Y) F3 Tankessho no Sakusei to Sono Scintillation Tokusei Hyoka" Dai 19 Kai Jinko Kessho Toronkai Koen Yoshishu, Nov. 9, 2004, pp. 14 to 15.

Akira Yoshikawa et al., "Ce; ( Gd, Y) F3 Tankessho no Sakusei Oyobi Scintillation Tokusei ni Oyobosu Genryo no Eikyo", Dai 49 Kai Jinko Kessho Toronkai Koen Yoshishu, Nov. 9, 2004, pp. 16 to 17.

Kei Kamata et al., "Ce, AE Kyotenka (Gd, Y) F3 Tankessho (AE=Mg, Ca, Sr, Ba) no Sakusei to Scintillation Tokusei Hyoka", Dai 52 Kai Extended abstracts; the Japan Society of Applied Physics, Mar. 29, 2005, separate vol. 1, p. 328, 30p-ZN-4.

* cited by examiner

SOLID SOLUTION MATERIAL OF RARE EARTH ELEMENT FLUORIDE (POLYCRYSTAL AND SINGLE CRYSTAL), AND METHOD FOR PREPARATION THEREOF, AND RADIATION DETECTOR AND TEST DEVICE

TECHNICAL FIELD

The present invention relates to a rare earth fluoride solid solution material (polycrystal and/or single crystal), and a production method thereof, as well as a radiation detector and a radiographic inspection apparatus.

BACKGROUND ART

Patent-related reference 1: JP-A-5-87934 (87934/1993)
Patent-related reference 2: JP-A-2004-137489

Because of excellent transmissivities over wide wavelength ranges, specific natures, and the like, fluoride crystals have been used as optical materials for optical lithography, crystals for all-solid-state ultraviolet/infrared laser, ultraviolet region window materials, scintillators, and the like. Among them, rare earth fluorides have been widely used as a scintillator, a dopant of an optical fiber amplifier, host and dopant of a solid-state laser material, and the like, by utilizing natures of rare earth elements, and by utilizing $Ce^{3+}$ in case of $CeF_3$. Further, since rare earth fluoride crystals each have a higher density in itself, these crystals can be expected to be utilized as scintillators, host materials of solid-state laser, and the like.

Rare earth fluorides are classified into those which exhibit primary phase transition at or below melting points thereof, respectively, and those which do not. $LaF_3$, $CeF_3$, $PrF_3$, and $NdF_3$ each have a Tysonite structure, and $TbF_3$, $DyF_3$, and $HoF_3$ each also have a $\beta$-$YF_3$ structure, and they do not exhibit primary phase transition in a range from a room temperature to each melting point, and are thus possible in single crystal growth from a melt. Meanwhile, the other rare earth fluorides ($SmF_3$, $EuF_3$, $GdF_3$, $ErF_3$, $TmF_3$, $YbF_3$, $LuF_3$, $YF_3$, and $ScF_3$) each exhibit primary phase transition (orthohombic<->hexagonal or orthohombic<->trigonal) at a temperature between a room temperature and each melting point, so that conduction of crystal growth from a melt leads to occurrence of cracks in the course of cooling. Otherwise, only polycrystals are obtained, thereby considerably obstructing development of a novel single crystal material. It is particularly regretful for a $LuF_3$ crystal having the highest density, that $LuF_3$ in itself is impossible in single crystal growth from a melt such as by a micro-pulling-down method, a Czochralski method, a Bridgman method, a zone melt method, or an Edge-defined Film-fed Growth (EFG) method, due to the problem of primary phase transition.

In a positron emission tomography (PET) apparatus, gamma rays (annihilation gamma rays: 511 eV) are to be detected by coincidence, so that there have been adopted scintillation detectors each having a higher sensitivity and being capable of obtaining a high speed response. As detector characteristics, there are required a higher time resolution for a higher counting rate property, removal of accidental coincidence noises, and the like, and there is desired an excellent energy resolution for eliminating scattered radiation from an interior of a body.

Thus, scintillators satisfying such requirements and suitable for detectors, are each required to have a higher density and a larger atomic number (a higher photoelectric absorption ratio) from a standpoint of detection efficiency, and a higher emission amount and a shorter fluorescence lifetime (fluorescence decay time) from standpoints of a required high speed response, a higher energy resolution, and the like. Further, since many scintillators are required to be densely arranged in fine and elongated configurations in recent multi-layered and high resolutive systems, important selection factors of scintillators include operability, processability, and cost.

Although Tl:NaI has been most typically used for a scintillation detector by virtue of a higher emission amount at a relatively low cost thereof, improved sensitivities of detectors can not be expected due to the lower density of Tl:NaI and the same is difficult in handling due to deliquescency thereof, so that Tl:NaI has been replaced by $Bi_4Ge_3O_{12}$ (BGO).

BGO has a wavelength of 490 nm, a refractive index of 2.15, and a density of 7.13 g/cm$^3$ which is two times as dense as that of Tl:NaI, so that BGO has a higher linear energy absorption coefficient for gamma rays. Further, although Tl:NaI has hygroscopicity, BGO does not have hygroscopicity thereby advantageously exhibiting a higher processability. It is noted that BGO has such defects that: the same has a fluorescence conversion efficiency which is 8% of that of Tl:NaI, so that an optical output of BGO for gamma rays is smaller than that of Tl:NaI; and BGO exhibits an energy resolution of 15% for gamma rays of 1 MeV, whereas Tl:NaI exhibits 7%. Moreover, its fluorescence decay time is relatively long on the order of 300 nsec, so that there is desired development of a scintillator having a shorter fluorescence lifetime so as to be utilized in devices such as PET, SPECT, and the like for photon counting.

Since $BaF_2$ has an extremely fast component (~0.8 nsec) in an ultraviolet region (near ~220 nm), there can be expected a higher time resolution. Thus, the same has been regarded as a leading candidate material for a scintillator of a PET of a time of flight (TOF) type utilizing a flight time difference. However, the obtained time resolution was on the order of 400 psec (calculated as about 6 cm of positional resolution), thereby failing to reach usage of a time information for direct imaging, while merely bringing about an improved signal-to-noise ratio and counting rate characteristics. Also concerning a photomultiplier tube (PMT), there is required an expensive window material in case of transmission of wavelengths near 220 nm, thereby leading to an increased cost of device. Moreover, $BaF_2$ exhibits a detection efficiency which is significantly inferior to that of BGO such that $BaF_2$ is low in resolving power and sensitivity characteristics, resulting in that development of PET's specialized in TOF types are rarely conducted now.

Ce:$Gd_2SiO_5$ (Ce:GSO) has been developed in Japan, which is a high performance scintillator well balanced in a density (6.71 g/cm$^3$), a light amount (two times that of BGO), a response speed (30 to 60 nsec), and a radiation resistance (>105 gray), though the same is slightly inferior to BGO in detection sensitivity. However, Ce:GSO is problematic, since the same also has a slightly delayed rising-up, positive-hysteresis (property by which a light amount is increased depending on irradiation) relative to radiation, and a strong cleavage property.

Currently, the most-advanced scintillator crystal is Ce-added $Lu_2SiO_5$ (Ce:LSO), which exhibits excellent scintillator characteristics such as a higher density (~7.39 g/cm$^3$), a shorter fluorescence lifetime (about 50 nsec), and a higher emission amount (three or more times that of BGO). The LSO crystal can be fabricated by the Czochralski method, so that the same provides a market of several hundreds of millions of dollars, mainly including companies in the United States such as CTI Molecular Imaging Inc. (CTI), Crystal Photonics Inc. (CPI). In turn, the LSO crystal has problems of increased production and working costs and a deteriorated yield, due to its characteristics such as an excessively higher melting point of 2,150° C., a higher anisotropy in linear expansion coefficients, and the like. Although there is typically used a metal called iridium (Ir) as a crucible material for melt growth of an oxide single crystal having a higher melting point, temperatures exceeding 2,000° C. are closer to the softening temperature of Ir, so that extremely severe temperature control is required for production of LSO crystal. In addition, since the usable lifetime of an Ir crucible is also short, extensive costs for recasting crucibles also become a severe burden to manufacturers. Further, there are required a high-frequency oscillator and a higher output for realizing such ultra-high temperatures, thereby generally increasing a running cost.

Meanwhile, concerning the Ce:GSO and Ce:LSO having been used as scintillator-oriented emission materials, although larger inclusion amounts of Ce acting as an emission element lead to higher emission amounts, inclusion amounts exceeding several % lead to significant concentration quenching, thereby failing to exhibit a scintillator effect.

Further, Ce is in a large size next to La among rare earth ions, and is significantly large as compared to representative rare earth ions (Y, Gd, Lu), resulting in that Ce exhibits an effective segregation coefficient largely deviated from "1". Namely, there is inevitably caused a compositional fluctuation of Ce along a growth direction thereof. This phenomenon becomes a cause of changing physical properties such as fluorescence decay time, emission amount, and the like, thereby causing a significant problem upon usage in a PET and the like of a high accuracy specification.

There have never been attained any materials based on fluorides, which simultaneously meet excellent scintillator characteristics, i.e., a higher density, a shorter fluorescence lifetime, and a higher emission amount.

Even under such circumstances, there is currently desired development of a next generation scintillator which has a higher energy absorption coefficient, is non-hygroscopic, and is high in energy resolution, time resolution, and the like, at a due cost.

Further, although Pr, Ce, F:$Gd_2O_2S$ ceramic scintillators described in the patent-related reference 1 are high in emission efficiency, single crystals in practical sizes can not be fabricated while light-transmitting ceramics can be narrowly fabricated. The light transmittance is about 60%/mm, so that fluorescence emitted in the scintillator does not reach a photodiode in a full amount, thereby deteriorating a sensitivity. Further, it has a problem of a complicated production process and a higher cost.

Meanwhile, described in the patent-related reference 2 is a technique aiming at providing a radiation detection material having a higher resolution than conventional materials and having an ultra high-speed response.

Its configuration resides in a fluoride single crystal material for detecting radiation characterized in that the material is a rare earth fluoride single crystal represented by $REF_3$ (RE is at least one selected from Sm, Eu, Gd, Tb, Dy, Ho, Er, Tm, Yb, and Lu).

There is also described a fluoride single crystal material for detecting radiation characterized in that the material is represented by $RE_{1-x}R_xF_3$ (x<0.5) such that the material includes, together with the above-mentioned RE, at least one element RE selected from rare earth elements other than the RE and La.

However, the patent-related reference 2 fails to describe any concrete combinations of RE and R. Further, only Lu is referred to as RE in its embodiments.

Additionally, since it is difficult to grow a single crystal from a melt due to the problem of primary phase transition as clearly described in item [0004] of the present specification, this patent-related reference has attempted a single crystal growth from a solution including potassium fluoride or the like added thereto as a flux. However, the crystal growth from a solution has undesirable features from a standpoint of optical crystal, such as a slower crystal growth rate, inclusion of the flux into the crystal as impurities, and the like.

Further, the emission wavelength of $Ce^{3+}$ in a cerium-substituted lutetium fluoride crystal of the patent-related reference 2 is 310 nm, which leads to a deteriorated sensitivity in case of adoption of a typical PMT made of quartz. When it is desired to give importance to sensitivity, there is thus required a specific PMT, thereby also causing a problem of cost. Moreover, although the cerium-substituted lutetium fluoride crystal has a higher emission wavelength as compared with $BaF_2$, the fluorescence lifetime of the former is 23 nsec, so that usage thereof for a TOF type is difficult. Additionally, although the fluorescence lifetime of a crystal of lutetium fluoride itself is described to be 0.8 nsec, the emission amount thereof is not described at all.

DISCLOSURE OF THE INVENTION

Problem to be Solved by the Invention

It is therefore an object of the present invention to provide a rare earth fluoride solid solution material (polycrystal and/or single crystal) and a production method thereof, where the solid solution material is obtained by dissolving a plurality of rare earth fluorides exhibiting phase transitions in each other in a solid state so that the solid solution material is utilizable as a scintillator, solid-state laser material, and the like.

It is another object of the present invention to realize a decreased production cost, while obtaining: a performance exceeding that of BGO; and physical properties equivalent to or exceeding those of GSO (high density (~6.71 g/cm$^3$), short fluorescence lifetime (60 nsec or shorter), and higher emission amount (two or more times that of BGO)). It is yet another object of the present invention to provide a rare earth fluoride solid solution material (polycrystal and/or single crystal) and a production method thereof, where the solid solution material as a fluoride material having a melting point lower than those of oxides is capable of achieving such an excellent scintillator material.

It is an additional object of the present invention to use a scintillator having stable characteristics (particularly, fluorescence output) to thereby provide a radiation detector and a radiographic inspection apparatus which are much excellent in detection sensitivity as compared with the conventional.

Means for Solving the Problem

In the present invention, (1) remark has been directed to ion radii of $TbF_3$, $DyF_3$, and $HoF_3$ which are rare earth fluorides exhibiting no phase transitions in a range from a room temperature to each melting point. It has been conceived that it becomes possible to grow a single crystal exhibiting no phase transitions by equalizing an averaged ion radius of cations to the remarked ion radii, i.e., by combining rare earth fluorides having phase transitions with each other, so that there have been earnestly investigated various combinations and ratios, thereby finding that a transparent rare earth fluoride solid solution single crystal can be grown from a melt. Further, (2) it has been succeeded to provide a specific crystal field for an activator (such as Ce) having a short fluorescence lifetime and to promote an energy transition from a mother crystal to the crystal field, by addition of a specific metal ion (M), particularly desirably an alkaline earth metal ion (AE), to thereby attain a higher absolute photoyield and a short fluorescence lifetime (decay time), thereby narrowly carrying out the present invention. Further, these effects lead to a fluorescence decay time of 50 nsec or shorter (near 400 nm) and/or 2 nsec or shorter (near 290 nm), thereby allowing expectation of a higher time resolution. This effect is not a behavior caused by a bandgap engineering where an absorption edge or an exciton emission position is shifted by addition of a dopant. Additionally, without limited to only combinations of rare earth fluorides exhibiting phase transitions, (3) it has been succeeded to obtain the phenomenon (2) by controlling concentrations of an activator and an energy transition promoter.

In this way, crystals obtained in the present invention are each a scintillator material, which has a high emission amount and a short fluorescence lifetime equivalent to or more excellent than those of a Ce:GSO scintillator crystal near 400 nm, and which has a high emission amount equivalent to that of BGO and an extremely short fluorescence lifetime of 2 nsec or less near 290 nm. Namely, the scintillator material of the present invention can be expected to be used for not only an ordinary scintillator device but also a TOF-oriented scintillator device. For example, the material of the present invention is apparently superior to $BaF_2$ as a candidate material for a scintillator of a TOF type of PET, i.e., the former has an emission amount several times larger than the latter, a density largely exceeding that of the latter, and a higher emission wavelength, so that the former can be expected to serve as a TOF type of PET material from now on.

Effect of the Invention

According to the present invention, it becomes possible to grow rare earth fluoride solid solution single crystals, and to utilize the same as a scintillator, a solid-state laser material, and the like. Further, according to the present invention, there have been found out fluoride scintillator crystals each having a performance exceeding BGO and physical properties equivalent to or superior to those of GSO. Further, the crystals each have a lower melting point (~1,350° C.), thereby allowing expectation of decreased electric-power amount, decreased cooling water amount, and the like for production of the crystals. Moreover, although Pt, Ir, and the like are each usable as a crucible material, it is also possible to use a carbon crucible which is inexpensive as compared with them, thereby also leading to a decreased production cost.

Figure 1:
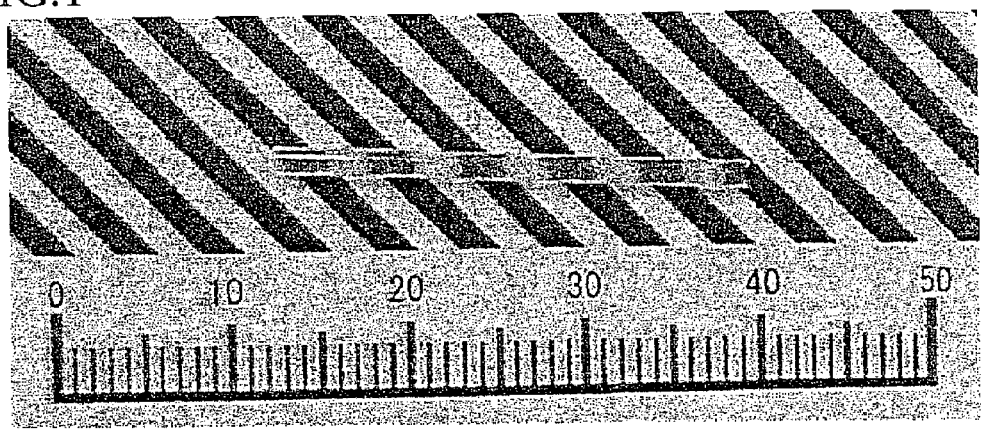
FIG. 1 An optical photograph instead of a figure, showing transparency of a $(Gd_{1-y}, Y_y)F_3$ (x=0.4) of Example 1.

EXPLANATION OF REFERENCE CHARACTERS a: Long lifetime emission from host (Gd).

b: Emission component having a higher absolute photoyield and a short fluorescence lifetime, obtained by giving a specific crystal field to Ce and by promoting an energy transition thereto from the host (Gd) and $Ce^{3+}$ in normal states.

c: Emission accompanying $Ce^{3+}$ 5d-4f transition. Emission component brought to have an ultrashort fluorescence lifetime, by virtue of the above-described action.

BEST MODES FOR CARRYING OUT THE INVENTION

In case of the rare earth fluoride solid solution material (polycrystal and/or single crystal) of the present invention, there are mutually combined a plurality of rare earth fluorides, which each exhibit a phase transition in a simplex form, and rare earth ions of which have different ion radii, respectively, so as to eliminate phase transitions, thereby enabling crystallization and/or single crystallization.

Namely, the rare earth fluoride solid solution of the present invention is characterized in that the same is represented by $(RE_yRE'_{1-y})F_3$ (0.0000<y<1.0000), because there has been found such a knowledge that a rare earth fluoride solid solution can be obtained by combining a fluoride(s) (exhibiting phase transition: orthohombic<->hexagonal) of Sm, Eu, and Gd, with a fluoride(s) (exhibiting phase transition: orthohombic<->trigonal) of Er, Tm, Yb, Lu, and Y, in a manner to equalize an averaged ion radius of the rare earth ions of the combination to rare earth ion radii of fluorides of Tb, Dy, and Ho exhibiting no phase transitions such that 1.05 Å>averaged ion radius>1.00 Å (in case of eight coordination), and the present invention has been completed by such a knowledge. In the above, RE represents one or two or more selected from Sm, Eu, and Gd, and RE' represents one or two or more selected from Er, Tm, Yb, Lu, and Y. Thus, the rare earth fluoride solid solution material (polycrystal and/or single crystal) is characterized in that the rare earth fluoride solid solution material includes cations having an averaged ion radius in a size (in case of eight coordination, e.g., 1.16 Å≧averaged ion radius>1.07 Å) which is equal to or less than an ion radius of $La^{3+}$ and larger than an ion radius of $Sm^{3+}$, or in a size (in case of eight coordination, e.g., 1.05 Å>averaged ion radius>1.00 Å) which is smaller than an ion radius of $Gd^{3+}$ and larger than an ion radius of $Er^{3+}$. In the above, $0.0000<y<1.0000$ when the rare earth fluoride solid solution is represented by $RE_yRE'_{1-y}F_3$ (RE represents one or two or more selected from Sm, Eu, and Gd, and RE' is one or two or more selected from Er, Tm, Yb, Lu, and Y), but this value is determined depending on combinations and is preferably within a range of $0.2000 \leq y \leq 0.9000$.

The rare earth fluoride solid solution $RE_yRE'_{1-y}F_3$ (RE is one or more of Sm, Eu, and Gd, and RE' is one or more of Er, Tm, Yb, Lu, and Y) of the present invention acting as a mother crystal, is concretely in such a form of $(Sm, Er)F_3$, $(Sm, Tm)F_3$, $(Sm, Yb)F_3$, $(Sm, Lu)F_3$, $(Sm, Y)F_3$, $(Eu, Er)F_3$, $(Eu, Tm)F_3$, $(Eu, Yb)F_3$, $(Eu, Lu)F_3$, $(Eu, Y)F_3$, $(Gd, Er)F_3$, $(Gd, Tm)F_3$, $(Gd, Yb)F_3$, $(Gd, Lu)F_3$, $(Gd, Y)F_3$, or $(Gd, Lu, Y)F_3$. Among them, Gd, Y, and Lu are desirable which are colorless in a visible range, and examples thereof include $(Gd, Lu)F_3$, $(Gd, Y)F_3$, and $(Gd, Lu, Y)F_3$.

Further, these rare earth fluoride solid solutions can be subjected to plural substitution by rare earth ions such as Ce, Yb, and the like serving as activators to be used in scintillator, solid-state laser, and the like. It has been found that an extremely superior scintillator material is obtained by adopting Ce, by which emission from 4f-5f transition can be expected, as an activator from among the rare earth ions. Namely, Ce is desirable, when a high speed scintillator material is envisaged.

Concrete examples include: $Ce:(Gd_y, Y_{1-y})F_3$: ($0.2000 \leq y \leq 0.9000$, 0.0010 wt $\% \leq$ Ce concentration $\leq 10.0000$ wt. %); $Ce:(Gd_y, Lu_{1-y})F_3$: ($0.2000 \leq y \leq 0.9000$, 0.0010 wt $\% \leq$ Ce concentration $\leq 10.0000$ wt. %); and the like. Particularly, it has been found that $Ce:(Gd_y, Lu_{1-y})F_3$ has excellent characteristics including: a density of 7.43 $g/cm^3$ or more when $y \geq 0.3000$, which exceeds densities of Ce:GSO and Ce:LSO having been used as scintillator emission materials; and an emission lifetime of 20 nsec, which also exceeds those of them.

Here, concerning a content of Ce, although higher Ce concentrations are desirable in view of an emission amount, 0.0010 wt $\% \leq$ Ce concentration $\leq 10.0000$ wt. % is desirable, totally taking account of concentration quenching, ion radius adjustment, and the like.

It has also been found that the materials obtained by the above concept, i.e., $Ce:(Gd_y, Y_{1-y})F_3$ ($0.2000 \leq y \leq 0.9000$, 0.0010 wt $\% \leq$ Ce concentration $\leq 10.0000$ wt. %) and $Ce:(Gd_y, Lu_{1-y})F_3$ ($0.2000 \leq y \leq 0.9000$, 0.0010 wt $\% \leq$ Ce concentration $\leq 10.0000$ wt. %), act as scintillator materials capable of shifting emission at 300 nm which is an emission wavelength of Ce to near 400 nm which is advantageous to a detector, by doping an alkaline earth metal including Mg, Ca, Sr, and/or Ba or an alkali metal including Li, Na, K, Rb, and/or Cs, into the obtained materials. Further, by these combinations of parent materials and activators, there can be expected application to a solid-state laser material. Moreover, although the above-mentioned ultra high-speed emission components have wavelengths of 300 nm or shorter, the emission wavelength of Ce according to the present invention having a high emission amount/short fluorescence lifetime (~30 nsec) is 350 nm or longer, thereby allowing a detector to adopt a general-purpose photomultiplier tube or semiconductor photodiode without using a quartz window. Namely, it is largely different from the patent-related reference 2. Although it is possible to adopt any one of the alkaline earth metals and alkali metals, the alkaline earth metals are desirable taking account of boiling point, hygroscopicity, and the like. Further, although Ca and Sr are desirable among the alkaline earth metals, Ca is particularly desirable taking account of an energy promotion effect. Moreover, the concentration of the alkaline earth metal is desirably represented such that 0.0010 wt $\% \leq$ alkaline earth metal concentration $< 15.0000$ wt %.

Concrete examples include $Sr_{0.01}Ce_{0.01}Gd_{0.43}Y_{0.55}F_{2.99}$, $Sr_{0.02}Ce_{0.01}Gd_{0.42}Lu_{0.55}F_{2.98}$, $Ca_{0.01}Ce_{0.01}Gd_{0.43}Y_{0.55}F_{2.99}$, $Ca_{0.02}Ce_{0.01}Gd_{0.42}Lu_{0.55}F_{2.98}$, and the like.

Although the fluoride crystals of the present invention are desirably single crystals taking account of quenching or increased long emission lifetime components due to crystal defects, the fluoride crystals may be ceramic bodies or in glass states.

Further, the present inventors have conducted an investigation and found that a residual oxygen component (including oxyfluoride) in a scintillator material leads to a decreased emission amount. As a result, it has become apparent that a higher emission amount can be maintained by restricting a residual oxygen concentration in a rare earth fluoride solid solution to less than 10,000 wtppm, desirably less than 1,000 wtppm, and particularly desirably less than 100 wtppm.

In the rare earth fluoride solid solution material (polycrystal and/or single crystal) represented by $(RE_yRE'_{1-y})F_3$ and/or $M:Ce:(RE_yRE'_{1-y})F_3$, although the absolute photoyield (photon/MeV) may be about 1,000 to 200,000 (photon/MeV), it is desirably 8,000 to 200,000 (photon/MeV), more particularly desirably 80,000 to 200,000 (photon/MeV), and among them, desirably 8,000 to 120,000 (photon/MeV), more desirably 16,000 to 80,000 (photon/MeV), thereby leading to a rare earth fluoride solid solution material (polycrystal and/or single crystal) having an extremely high emission amount. Namely, the absolute photoyield ratio as compared to BGO, is 0.125 to 25, desirably 1 to 25, and particularly desirably 10 to 25. Further, absolute photoyield ratios of 1 to 15 are desirable, and 2 to 10 are more desirable, from a standpoint of technical effect taking account of a relationship to a lengthened fluorescence lifetime due to energy transition.

Further, in case of the rare earth fluoride solid solution material (polycrystal and/or single crystal) of the present invention, it has been succeeded to obtain the above-mentioned phenomenon by controlling concentrations of an activator and an energy transition promoter, without limited to only combinations of rare earth fluorides having phase transitions.

Namely, according to the present invention, it becomes possible to largely improve an absolute photoyield than 8,200 photon/MeV of BGO, by adopting a rare earth fluoride solid solution material (polycrystal and/or single crystal) represented by $M_xRE_yRE'_{1-x-y}F_z$, desirably a rare earth fluoride solid solution material (polycrystal and/or single crystal) represented by $AE_xRE_yRE'_{1-x-y}F_z$, more desirably a rare earth fluoride solid solution material (polycrystal and/or single crystal) represented by $AE_xRE_yGd_{1-x-y}F_z$, and among them, particularly desirably a rare earth fluoride solid solution material (polycrystal and/or single crystal) represented by $Sr_xCe_yGd_{1-x-y}F_z$.

In the above, RE is one or two or more rare earth elements selected from Ce, Pr, Nd, Eu, Tb, Ho, Er, Tm, and Yb, and Ce is particularly desirable among them. Further, RE' is one or two or more selected from La, Sm, Gd, Dy, Lu, Y, and Sc.

Further, M is not particularly limited insofar as it is one or more of Li, Na, K, Rb, Cs, Mg, Ca, Sr, Ba, Mn, Fe, Co, Ni, Cu, Zn, Pd, Cd, Pb, Zr, and Hf. However, Mg, Ca, Sr, and Ba are desirable among them, which are alkaline earth metals (AE). More desirably, AE is Ca or Sr, and Sr is particularly desirable from a standpoint of density.

Moreover, although RE' is not particularly limited insofar as it is La, Sm, Gd, Dy, Lu, Y, or Sc as noted above, those materials including Gd among RE's are desirable, which are then represented by $M_xCe_y(Gd_wRE'_{1-w})_{1-x-y}F_z$, desirably $AE_xCe_y(Gd_wRE'_{1-w})_{1-x-y}F_z$. Further, those materials are desirable including Gd only as RE', which are then represented by $M_xRE_yGd_{1-x-y}F_z$, desirably $AE_xRE_yGd_{1-x-y}F_z$. Among them, those materials are particularly desirable including Ce as RE, which are then represented by $M_xCe_yGd_{1-x-y}F_z$, desirably $AE_xCe_yGd_{1-x-y}F_z$.

Similarly, although M is not particularly limited insofar as it is Li, Na, K, Rb, Cs, Mg, Ca, Sr, Ba, Mn, Fe, Co, Ni, Cu, Zn, Pd, Cd, Pb, Zr, or Hf as noted above, those materials including Mg, Ca, Sr, and Ba, particularly Ca and Sr as AE are desirable, which are then represented by $Ca_xRE_yRE'_{1-x-y}F_z$ and $Sr_xRE_yRE'_{1-x-y}F_z$. Further, those materials including Ce as RE are desirable, which are represented by $Ca_xCe_yRE'_{1-x-y}F_z$ and $Sr_xCe_yRE'_{1-x-y}F_z$. Meanwhile, those materials are desirable including Gd only as RE', which are represented by $Ca_xRE_yGd_{1-x-y}F_z$ and $Sr_xRE_yGd_{1-x-y}F_z$. Among them, those materials are particularly desirable which include Ce as RE and Gd only as RE', which are then rare earth fluoride solid solution materials (polycrystal and/or single crystal) represented by $Ca_xCe_yGd_{1-x-y}F_z$ and $Sr_xCe_yGd_{1-x-y}F_z$.

The rare earth fluoride solid solutions of the present invention are represented as follows, when Ce is adopted as RE, for example.

Examples thereof include $Mn_{0.02}Ce_{0.01}Sm_{0.42}Er_{0.55}F_{2.98}$, $Ca_{0.03}Ce_{0.03}Sm_{0.54}Tm_{0.40}F_{2.97}$, $Ca_{0.03}Ce_{0.03}Sm_{0.54}Yb_{0.40}F_{2.97}$, $Zn_{0.03}Ce_{0.03}Sm_{0.54}Lu_{0.40}F_{2.97}$, $Ca_{0.05}Ce_{0.01}Sm_{0.54}Y_{0.40}F_{2.95}$, $Ba_{0.05}Ce_{0.01}Eu_{0.54}Er_{0.40}F_{2.95}$, $Co_{0.01}Ce_{0.05}Eu_{0.54}Tm_{0.40}F_{2.99}$, $Ni_{0.01}Ce_{0.05}Eu_{0.54}Yb_{0.40}F_{2.99}$, $Mg_{0.01}Ce_{0.05}Eu_{0.54}Lu_{0.04}F_{2.99}$, $Li_{0.02}Ce_{0.06}La_{0.42}Y_{0.50}F_{2.96}$, $Na_{0.02}Ce_{0.06}Sc_{0.42}Er_{0.50}F_{2.96}$, $Rb_{0.02}Ce_{0.06}Gd_{0.42}Tm_{0.50}F_{2.96}$, $Cs_{0.02}Ce_{0.01}Y_{0.77}Yb_{0.20}F_{2.96}$, $K_{0.02}Ce_{0.01}Gd_{0.37}Lu_{0.30}Sm_{0.30}F_{2.96}$, $Sr_{0.01}Ce_{0.01}Gd_{0.60}Y_{0.10}Lu_{0.28}F_{2.99}$, $Pd_{0.01}Ce_{0.01}Gd_{0.60}Y_{0.10}Eu_{0.28}F_{2.99}$, $Fe_{0.01}Ce_{0.01}Gd_{0.98}F_{2.99}$, $Cd_{0.03}Ce_{0.02}Lu_{0.95}F_{2.97}$, $Sr_{0.03}Ce_{0.02}Sm_{0.95}F_{2.97}$, $Zr_{0.01}Ce_{0.01}Gd_{0.98}F_{3.01}$, $Hf_{0.01}Ce_{0.01}Y_{0.98}F_{3.01}$, $Sr_{0.10}Ce_{0.07}Eu_{0.83}F_{2.90}$, $Ba_{0.14}Ce_{0.06}Er_{0.80}F_{2.86}$, $Ca_{0.07}Ce_{0.80}Tm_{0.13}F_{2.93}$, and $Mg_{0.07}Ce_{0.80}Yb_{0.13}F_{2.93}$.

Further, substantially the same representations are applicable, also in case of adopting Pr, Nd, Eu, Tb, Ho, Er, Tm, or Yb as RE. Several examples thereof include such representations of $Ca_{0.09}Pr_{0.01}Gd_{0.90}F_{2.91}$, $Ca_{0.14}Nd_{0.01}Gd_{0.60}Y_{0.25}F_{2.86}$, $Sr_{0.01}Eu_{0.19}Lu_{0.80}F_{2.99}$, $Sr_{0.07}Tb_{0.10}Lu_{0.83}F_{2.93}$, $Sr_{0.10}H_{0.10}Lu_{0.80}F_{2.90}$, $Sr_{0.01}Tm_{0.01}Gd_{0.78}Lu_{0.20}F_{2.99}$, $Sr_{0.01}Yb_{0.01}Sm_{0.78}Er_{0.20}F_{2.99}$, $Ba_{0.01}Eu_{0.01}Gd_{0.78}Y_{0.20}F_{2.99}$, and $Ba_{0.01}Tm_{0.01}Gd_{0.78}Er_{0.20}F_{2.99}$.

Desirable as the rare earth fluoride solid solution material (polycrystal and/or single crystal) represented by $M_xRE_yRE'_{1-x-y}F_z$, are rare earth fluoride solid solution materials (polycrystal and/or single crystal) represented by $AE_xRE_yRE'_{1-x-y}F_z$. More desirable are rare earth fluoride solid solution materials (polycrystal and/or single crystal) represented by $AE_xRE_yGd_{1-x-y}F_z$. Particularly desirable among them are rare earth fluoride solid solution materials (polycrystal and/or single crystal) represented by $Sr_xCe_yGd_{1-x-y}F_z$. In this composition, although the absolute photoyield (photon/MeV) may be about 1,000 to 200,000 (photon/MeV), it is desirably 8,000 to 200,000 (photon/MeV), more particularly desirably 80,000 to 200,000 (photon/MeV), and among them, desirably 8,000 to 120,000 (photon/MeV), more desirably 16,000 to 80,000 (photon/MeV), thereby leading to a rare earth fluoride solid solution material (polycrystal and/or single crystal) having an extremely high emission amount. Namely, the absolute photoyield ratio as compared to BGO, is 0.125 to 25, desirably 1 to 25, and particularly desirably 10 to 25. Further, absolute photoyield ratios of 1 to 15 are desirable, and 2 to 10 are more desirable, from a standpoint of technical effect taking account of a relationship to a lengthened fluorescence lifetime due to energy transition.

Further, RE is Ce, Pr, Nd, Eu, Tb, Ho, Er, Tm, or Yb, particularly desirably Ce, in the rare earth fluoride solid solution materials (polycrystal and/or single crystal) represented by $M_xRE_yRE'_{1-x-y}F_z$, (desirably in rare earth fluoride solid solution materials (polycrystal and/or single crystal) represented by $AE_xRE_yRE'_{1-x-y}F_z$, more desirably in rare earth fluoride solid solution materials (polycrystal and/or single crystal) represented by $AE_xRE_yGd_{1-x-y}F_z$, and particularly desirably in rare earth fluoride solid solution materials (polycrystal and/or single crystal) represented by $Sr_xCe_yGd_{1-x-y}F_z$. Moreover, the concentration "y" of RE is $0.0000 \leq y < 1.0000$, desirably $0.0000 < y \leq 0.5000$, more desirably $0.0050 \leq y \leq 0.4000$, and particularly desirably $0.0100 \leq y \leq 0.3000$.

Furthermore, in the rare earth fluoride solid solution materials (polycrystal and/or single crystal) represented by $M_xRE_yRE'_{1-x-y}F_z$, the activator concentration is extremely high where concentration quenching of Ce such as caused in Ce:GSO and the like becomes significant, so that the activator (such as Ce) as an emission element can be dissolved in a solid state in a larger amount, which is one of the features of the materials and which can be regarded as an advantageous feature as a scintillator crystal.

Also the rare earth fluoride solid solution materials (polycrystal and/or single crystal) represented by $M_xRE_yRE'_{1-x-y}F_z$ including Ce dissolved therein in a solid state at a higher concentration ($0.5000 \leq y < 1.0000$, desirably $0.7000 \leq y < 1.0000$, particularly desirably $0.9000 \leq y < 1.0000$), serve as extremely superior scintillator crystals, respectively.

In turn, in the composition of the rare earth fluoride solid solution materials (polycrystal and/or single crystal) represented by $M_xRE_yRE'_{1-x-y}F_z$, the concentration of M, desirably the concentration of AE, and more particularly desirably the concentration of Sr, is $0.0000 \leq x < 0.1500$, desirably $0.00001 \leq x \leq 0.1300$, and particularly desirably $0.0005 \leq x \leq 0.1000$.

Meanwhile, in the composition of the rare earth fluoride solid solution materials (polycrystal and/or single crystal) represented by $M_xRE_yRE'_{1-x-y}F_z$, the range of "z" representing the amount of F is a constant to be necessarily determined by values of x and y, and is concretely $0.5000 \leq z \leq 4.5000$, desirably $1.5000 \leq z \leq 3.5000$, more desirably $2.5000 \leq z \leq 3.5000$, and particularly desirably $2.8000 \leq z \leq 3.2000$.

Summarizing the above, in order to increase an absolute photoyield (photon/MeV) near 400 nm, it is particularly desirable to increase a concentration of an activator (such as Ce) and to set a lower concentration of M (such as Sr). Further, although the above-mentioned ultra high-speed components have emission wavelengths of 300 nm or shorter, the emission wavelength of Ce according to the present invention having a high emission amount/short fluorescence lifetime (~30 nsec) is 350 nm or longer, thereby allowing a detector to adopt a general-purpose photomultiplier tube or semiconductor photodiode without using a quartz window. Namely, it is largely different from the patent-related reference 2.

In this way, also in the rare earth fluoride solid solution materials (polycrystal and/or single crystal) represented by $M_xRE_yRE'_{1-x-y}F_z$, it becomes possible to obtain a rare earth fluoride solid solution material (polycrystal and/or single crystal) which has a Tysonite structure or $\beta$-$YF_3$ structure and which is free of primary phase transition: by mutually combining fluorides represented by M and/or rare earth fluorides represented by RE or RE in a manner to attain an averaged ion radius value thereof equivalent to ion radius values of $TbF_3$, $DyF_3$, and $HoF_3$; or by mutually combining fluorides represented by M and/or rare earth fluorides represented by RE or RE in a manner to attain an averaged ion radius value thereof equivalent to ion radius values of $LaF_3$, $CeF_3$, $PrF_3$, and $NdF_3$.

Meanwhile, as starting materials to be used for rare earth fluoride solid solution materials (polycrystal and/or single crystal) represented by $(RE_yRE'_{1-y})F_3$ and/or M:Ce: $(RE_yRE'_{1-y})F_3$, or rare earth fluoride solid solution materials (polycrystal and/or single crystal) represented by $M_xRE_yRE'_{1-x-y}F_z$, it is possible to use typical starting fluoride materials; however, in case of usage as a scintillator material-oriented single crystal, it is particularly desirable to use high purity fluoride materials of 99.9% or higher (3N or higher) such that these materials are weighed and mixed with one another into an intended composition. Further, such starting fluoride materials are particularly desirable, in which impurities other than the intended composition are extremely less (1 ppm or less, for example). Moreover, the starting materials to be used each desirably have an oxygen concentration of 1,000 wtppm or less, and particularly desirably an oxygen concentration of 100 wtppm or less. Even in case of using starting materials having higher oxygen concentrations, it becomes possible to obtain a high-quality crystal, by conducting a pretreatment in a fluorine compound gas ambient or adding 10% or less of a fluorine compound as a scavenger, to thereby achieve a melt in a lower oxygen state (100 wtppm or less, for example) upon crystal growth.

Since the rare earth fluoride solid solution materials (polycrystal and/or single crystal) represented by $(RE_yRE'_{1-y})F_3$ and/or M:Ce:$(RE_yRE'_{1-y})F_3$, or the rare earth fluoride solid solution materials (polycrystal and/or single crystal) represented by $M_xRE_yRE'_{1-x-y}F_z$, are all rare earth fluorides, residual oxygen even in a small amount easily leads to rare earth oxyfluoride.

Further, although the fluoride materials of the present invention are desirably single crystals taking account of quenching or increased long emission lifetime components due to crystal defects, the fluoride materials may be ceramic bodies or in glass states.

Further, the present inventors have conducted an investigation and found that a residual oxygen component (including oxyfluoride) in a scintillator material leads to a decreased emission amount. As a result, it has become apparent that a higher emission amount can be maintained by restricting a residual oxygen concentration in a rare earth fluoride solid solution to less than 10,000 wtppm, more desirably less than 1,000 wtppm, and particularly desirably less than 100 wtppm.

In the course of crystal production, production is desirably conducted in an atmosphere of gas including fluorine compound, in addition to in a vacuum atmosphere, in an inert gas atmosphere, and in an extremely low oxygen atmosphere. This is also true, in a pre-treatment process such as melting operation of starting materials and a post-treatment process such as annealing, in addition to the single crystal production process. Here, although $CF_4$ is particularly desirable as a gas including a fluorine compound, $F_2$ gas, HF, $BF_3$ gases, and the like are also usable. Further, it is possible to use such gases by diluting them with an inert gas (Ar, $N_2$, He, or the like, for example).

Although, as a production method of the rare earth fluoride solid solution materials (polycrystal and/or single crystal) represented by $(RE_yRE'_{1-y})F_3$ and/or M:Ce: $(RE_yRE'_{1-y})F_3$, or the rare earth fluoride solid solution materials (polycrystal and/or single crystal) represented by $M_xRE_yRE'_{1-x-y}F_z$, it is possible to use a micro-pulling-down method, a Czochralski method, a Bridgman method, a zone melt method, an EFG method, and the like without particularly limited thereto, the Czochralski method or Bridgman method is desirable in order to obtain a large-sized single crystal for the purpose of improving a yield and relatively mitigating a process loss. Meanwhile, although the zone melt method, EFG method, and micro-pulling-down method are desirable when only a small-sized single crystal is used as a scintillator crystal because a post-treatment process is not required or is conducted minimally then, the micro-pulling-down method and zone melt method are particularly desirable from reasons of wettability to a crucible and the like.

Namely, it is desirable to grow a single crystal by the micro-pulling-down method, from a melt having a composition represented by $(RE_yRE'_{1-y})F_3$ where $0.0000 \leq y < 1.0000$, preferably $0.2000 \leq y \leq 0.9000$ according to the present invention. In the above, RE represents one or two or more selected from Sm, Eu, and Gd, and RE' represents one or two or more selected from Er, Tm, Yb, Lu, and Y.

Similarly, it is desirable to grow a single crystal by the micro-pulling-down method, from a melt having a composition represented by $M_xRE_yGd_{1-y}F_z$ where $0.0000 \leq y < 1.0000$, $1.5000 \leq z \leq 3.5000$, and $0.0000 \leq x < 0.1500$. In the above, RE is one or two or more selected from Ce, Pr, Nd, Eu, Tb, Ho, Er, Tm, or Yb, RE' is one or two or more selected from La, Sm, Gd, Dy, Lu, Y, and Sc, and M is one or more of Mg, Ca, Sr, and Ba.

Further, since all the starting fluoride materials have melting points lower than 1,500° C., it is enough to use a temperature lower than 1,500° C. in a crystal growth operation in any one of the micro-pulling-down method, Czochralski method, Bridgman method, zone melt method, and EFG method. Thus, also the output of a high-frequency oscillator is significantly decreased as compared with GSO, thereby leading to a decreased production cost. Further, it is possible to use not only the high-frequency oscillator but also a resistance heating method. Moreover, although it is of course possible to adopt platinum, iridium, rhodium, rhenium, or an alloy thereof as a crucible and an after-heater to be used, it is allowed to use carbon which is undesirable in itself for a crystal fabrication process of oxides such as GSO, thereby leading to a further decreased production cost.

There will be described a single crystal production method adopting the micro-pulling-down method for an emission material of the present invention, without limited thereto.

The micro-pulling-down method is to be conducted by using a precise atmosphere control type micro-pulling-down apparatus based on high-frequency induction heating. The micro-pulling-down apparatus is a unidirectional solidification crystal growth apparatus provided with: a crucible; a seed holder for holding a seed to be contacted with a melt flowing out of a small hole provided at a bottom of the crucible; a movement mechanism for downwardly moving the seed holder; a movement speed controlling apparatus for the movement mechanism; and induction heating means for heating the crucible.

The crucible is made of carbon, platinum, iridium, rhodium, rhenium, or an alloy thereof, and there is arranged an after-heater around an outer periphery of the crucible bottom, which after-heater is a heat generator made of carbon, platinum, iridium, rhodium, rhenium, or an alloy thereof. The crucible and after-heater are made possible in adjustment of heating value by adjusting an output of the induction heating means, thereby making it possible to control a temperature and a distribution of a solid-liquid boundary region of a melt to be pulled out of the small hole provided at the crucible bottom.

Further, the precise atmosphere control type micro-pulling-down apparatus enables a crystal growth of fluoride, thereby enabling an atmosphere within a chamber to be precisely controlled. The apparatus is one which adopts SUS as a material of the chamber and $CaF_2$ as a window material, and an additional diffusion pump or turbo molecular pump in addition to an existing rotary pump so as to enable a high vacuum evacuation which is most important for fluoride crystal growth, thereby enabling a degree of vacuum of $1 \times 10^{-3}$ Pa or lower. Further, it is possible to introduce $CF_4$, Ar, $N_2$, $H_2$ gas or the like, into the chamber, at flow rates precisely adjusted by an accompanying gas flowmeter.

The apparatus is used to introduce starting materials prepared in the above described manner into the crucible, and the interior of a furnace is evacuated to high vacuum, and thereafter baking is conducted for eliminating moisture adsorbed at a surface thereof, followed by introduction of a high purity Ar gas (6N product) or high purity $CF_4$ gas (6N product) to bring the furnace interior to an inert gas or fluorine compound gas atmosphere, and then the crucible is heated by gradually applying a high-frequency electric-power to a high-frequency induction heating coil, thereby fully melting the starting materials in the crucible.

Next, the crystal is grown in the following procedure. Namely, the seed crystal is gradually raised at a predetermined speed, the tip end thereof is contacted with the small hole of the lower end of the crucible and is made fully intimate with the melt, and then the pulling-down shaft is lowered while adjusting the melt temperature, thereby growing the crystal. As the seed crystal, it is desirable to use one having a structure and a composition which are equivalent to or analogous to those of a crystal growth target, without limited thereto. It is further desirable to use a seed crystal having a definite orientation. The crystal growth is to be finished, once the prepared materials are fully crystallized such that the melt is exhausted. Meanwhile, for the purpose of keeping a uniform composition of the crystal and elongation thereof, it is possible to incorporate a device for continuously charging the starting materials.

Usable as a radiation detector is a combination of: a scintillator made of the rare earth fluoride solid solution material (polycrystal and/or single crystal) represented by $(RE_yRE'_{1-y})F_3$ and/or $M:Ce:(RE_yRE'_{1-y})F_3$, or the rare earth fluoride solid solution material (polycrystal and/or single crystal) represented by $M_xRE_yRE'_{1-x-y}F_z$; with optical response means. Further, it can also be used as a radiographic inspection apparatus characterized in that the same is provided with the above described radiation detector as a radiation detector.

Further, by virtue of realization of the rare earth fluoride solid solution materials (polycrystal and/or single crystal) represented by $(RE_yRE'_{1-y})F_3$ and/or $M:Ce:(RE_yRE'_{1-y})F_3$, or the rare earth fluoride solid solution materials (polycrystal and/or single crystal) represented by $M_xRE_yRE'_{1-x-y}F_z$, it becomes possible to provide a radiographic inspection apparatus capable of obtaining a photographed image with a higher resolution.

Preferable as the radiographic inspection apparatus is a medical image processor such as PET, X-ray CT, SPECT, and the like. Further, preferable examples of PET's include a two-dimensional PET, a three-dimensional PET, a TOF type PET, a depth of interaction (DOI) type PET, without particularly limited thereto. Further, these may be used combinedly.

BGO having been used as a scintillator emission material has a fluorescence decay time of 300 nsec at a room temperature, thereby failing to expect a higher time resolution.

Meanwhile, although the rare earth fluoride solid solution materials (polycrystal and/or single crystal) represented by $(RE_yRE'_{1-y})F_3$ and/or $M:Ce:(RE_yRE'_{1-y})F_3$, or the rare earth fluoride solid solution materials (polycrystal and/or single crystal) represented by $M_xRE_yRE'_{1-x-y}F_z$, each have an absolute photoyield ratio of 0.125 to 25, desirably 1 to 25, particularly desirably 10 to 25 relative to BGO to thereby possess an extremely higher emission amount, at least one of fluorescence components of the solid solution material has a decay time of 50 nsec or shorter (near 400 nm) at a room temperature, thereby enabling expectation of a higher time resolution.

This allows a detector to adopt a general-purpose photomultiplier tube or semiconductor photodiode without using a quartz window.

Meanwhile, although there have been invented various fluoride crystals and the like exhibiting fluorescence components at least one of which has a decay time of ~50 nsec or shorter at a room temperature, these are all low in emission amount, so that they have not been practically used as scintillator materials yet.

Further, although $BaF_2$ having been used for a TOF type of PET exhibits emission having an extremely fast decay time of ~0.8 nsec, the emission is in an ultraviolet region and has an amount which is equal to or less than half of the lower emission amount of BGO, thereby currently causing a demand for a new crystal for a TOF type of PET.

The presently developed rare earth fluoride solid solution materials (polycrystal and/or single crystal) represented by $(RE_yRE'_{1-y})F_3$ and/or $M:Ce:(RE_yRE'_{1-y})F_3$, or rare earth fluoride solid solution materials (polycrystal and/or single crystal) represented by $M_xRE_yRE'_{1-x-y}F_z$, each have, near 290 nm, an absolute photoyield ratio of 0.125 to 25, desirably 1 to 25, particularly desirably 10 to 25 relative to BGO to thereby possess a higher emission amount, while at least one fluorescence components of each crystal has a decay time of 2 nsec or shorter, more desirably 1 nsec or shorter at a room temperature, so that the materials simultaneously have high emission amounts and short fluorescence lifetimes (smaller decay constants), thereby enabling expectation of usage for a TOF type of PET.

Additionally, usable as a radiation detector is a combination of: a scintillator utilizing the above-described crystal, thereby exhibiting an ultrashort fluorescence lifetime; a position sensitive photomultiplier tube (PS-PMT), photodiode (PD), or avalanche photodiode (APD); and optical response means. Further, it can also be used as a radiographic inspection apparatus characterized in that the same is provided with the above described radiation detector as a radiation detector. Moreover, it is possible to use the radiographic inspection apparatus in a simplex form, or in a manner combined with a magnetic resonance imaging (MRI), computed tomography (CT), single photon emission computed tomography (SPECT) apparatus, or a gamma camera, or any combination thereof.

EXAMPLES

Examples 1 to 3

Table 1 shows fabricating conditions of $(Gd_{1-y}, Y_y)F_3$, $(Gd_{1-y}, Yb_y)F_3$, and $(Gd_{1-y}, Lu_y)F_3$ single crystals according to Examples 1 to 3 (Nos. 1 to 3).

TABLE 1

| No. | Compound composition | Starting materials | Optimum composition |
|---|---|---|---|
| 1 | $(Gd_{1-x}, Y_x)F_3$<br>x = 0.2, 0.4, 0.6, 0.8 | $GdF_3$(5N)<br>$YF_3$(5N) | $0.4 \leq x \leq 0.6$ |
| 2 | $(Gd_{1-x}, Yb_x)F_3$<br>x = 0.2, 0.4, 0.6, 0.8 | $GdF_3$(5N)<br>$YbF_3$(5N) | $0.2 \leq x \leq 0.6$ |
| 3 | $(Gd_{1-x}, Lu_x)F_3$<br>x = 0.2, 0.4, 0.6, 0.8 | $GdF_3$(5N)<br>$LuF_3$(4N) | $0.2 \leq x \leq 0.6$ |

Figure 2:
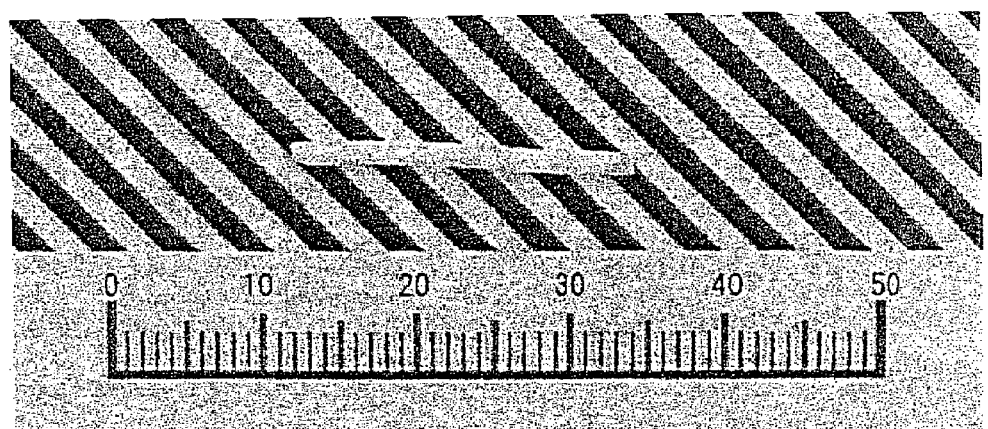
FIG. 2 An optical photograph instead of a figure, showing an influence of phase transition of $YF_3$.
Figure 3:
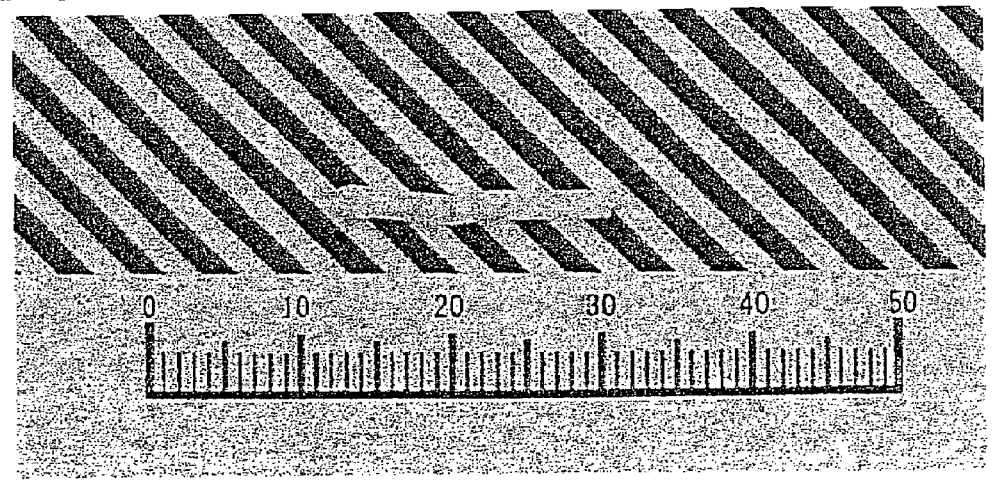
FIG. 3 An optical photograph instead of a figure, showing an influence of phase transition of $GdF_3$.
Figure 4:
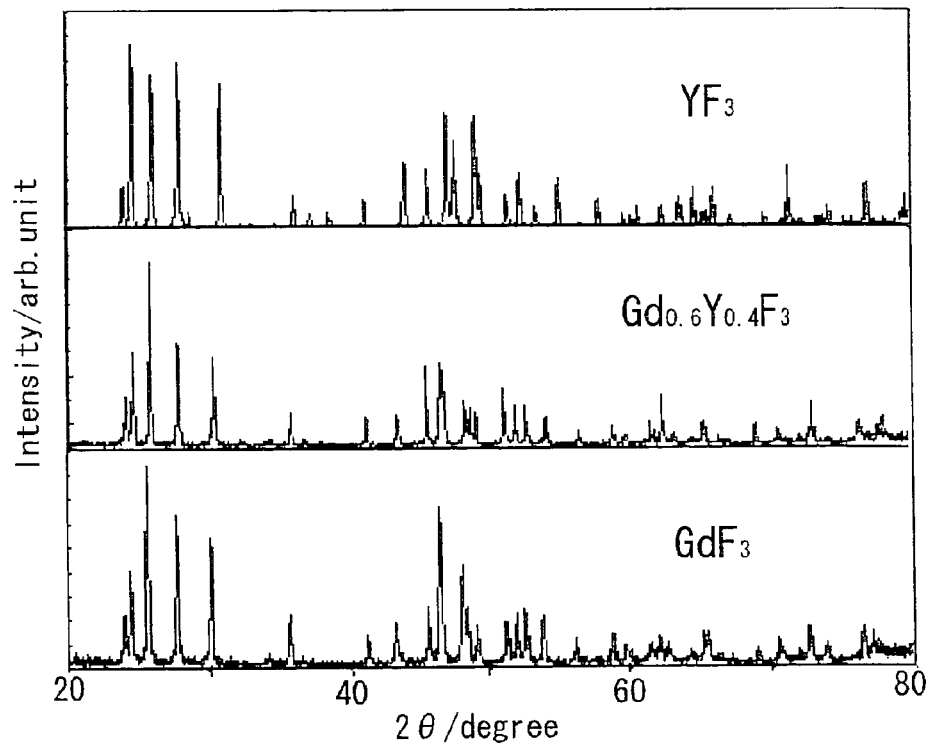
FIG. 4 Powder X-ray diffraction results of $YF_3$, $GdF_3$, and $(Gd_{1-y}, Y_y)F_3$ (x=0.4).

FIG. 1 shows a photograph of a single crystal represented by $(Gd_{1-y}, Y_y)F_3$ (x=0.4). FIG. 2 shows a crystal photograph of $YF_3$, and FIG. 3 shows a crystal photograph of $GdF_3$. It is understood therefrom that although $YF_3$ and $GdF_3$ each exhibit phase transition to thereby lead to cloudy polycrystals, there can be obtained a transparent crystal from $(Gd_{1-y}, Y_y)F_3$ (x=0.4). FIG. 4 shows powder X-ray diffraction results thereof. From the powder X-ray diffraction, it is understood that the crystal is a solid solution.

Examples 4 to 10

Table 2 shows scintillation characteristics of Examples 4 to 10 (Nos. 4 to 10).

TABLE 2

| No. | Compound composition | Ce conc. | Emission wavelength | Emission intensity | Fluorescence lifetime | Density |
|---|---|---|---|---|---|---|
| 4 | $(Gd_{0.6}, Y_{0.39}, Ce_{0.01})F_3$ | 1% | 300 nm | 70 | 20 ns | 6.26 g/cm³ |
| 5 | $(Gd_{0.6}, Y_{0.37}, Ce_{0.03})F_3$ | 3% | 300 nm | 110 | 21 ns | 6.26 g/cm³ |
| 6 | $(Gd_{0.6}, Y_{0.35}, Ce_{0.05})F_3$ | 5% | 300 nm | 80 | 20 ns | 6.26 g/cm³ |
| 7 | $(Gd_{0.67}, Lu_{0.3}, Ce_{0.03})F_3$ | 3% | 300 nm | 200 | 20 ns | 7.43 g/cm³ |
| 8 | $(Gd_{0.6}, Y_{0.34}, Ce_{0.03}, Ba_{0.03})F_3$ | 3% | 300 nm | 220 | 20 ns | 6.26 g/cm³ |
| 9 | $(Gd_{0.6}, Y_{0.34}, Ce_{0.03}, Sr_{0.03})F_3$ | 3% | 400 nm | 250 | 25 ns | 6.26 g/cm³ |
| 10 | $(Gd_{0.4}, Y_{0.27}, Lu_{0.3}, Ce_{0.03})F_3$ | 3% | 300 nm | 180 | 20 ns | 6.67 g/cm³ |
| CE | $CeF_3$ | 100% | 300 nm | 100 | 30 ns | 6.16 g/cm³ |

CE: Comparative Example
Note that an emission intensity is indexed based on a value of 100 of $CeF_3$.

Since $BGO/CeF_3=2$ in absolute photoyield ratio, the $(Gd_{0.60}, Y_{0.34}, Ce_{0.03}, Sr_{0.03})F_3$ has an absolute photoyield ratio of 1.25 relative to BGO.

Further, there has been considered $(Gd_{0.325}Y_{0.60}Ce_{0.07}Ca_{0.005})F_3$ as Example 11, resulting in that it exhibits emission wavelengths of 290 nm and 380 nm which have absolute photoyield ratios of 1.1 and 8.0 relative to BGO, respectively. Further, fluorescence lifetimes thereof are 0.2 nsec and 35 nsec, respectively.

From the above, it is understood that Examples 4 to 10 utilize natures of rare earth fluorides and have superior characteristics, in a manner to each possess: a higher density; a fluorescence lifetime faster than those (40 to 60 ns) of GSO, LSO utilizing Ce; and an emission intensity which is the same as or superior to that of BGO.

Example 11

There was grown a rare earth fluoride solid solution single crystal represented by $M_xRE_yRE'_{1-x-y}F_z$, (M=Sr, RE=Ce, RE'=GD) based on the micro-pulling-down method.

Figure 5:
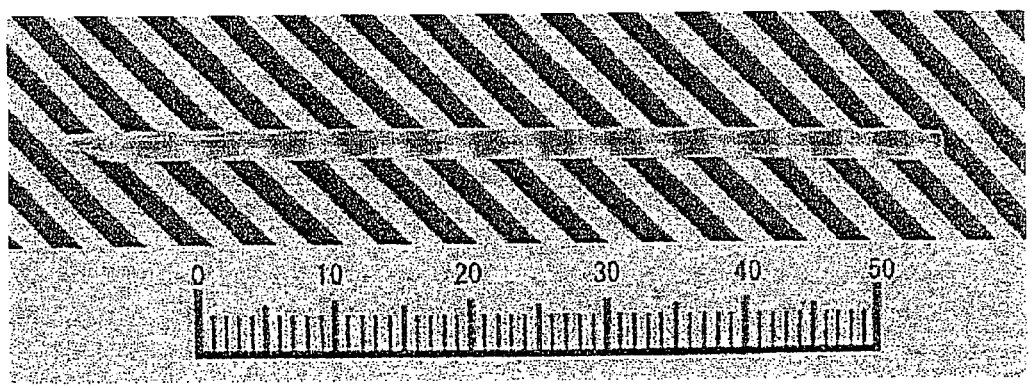
FIG. 5 An exemplary crystal photograph of $M_xRE_yRE'_{1-x-y}F_z$: (M=Sr, RE=Ce, RE'=Gd, Y, x<0.15) according to the present invention.
Figure 6:
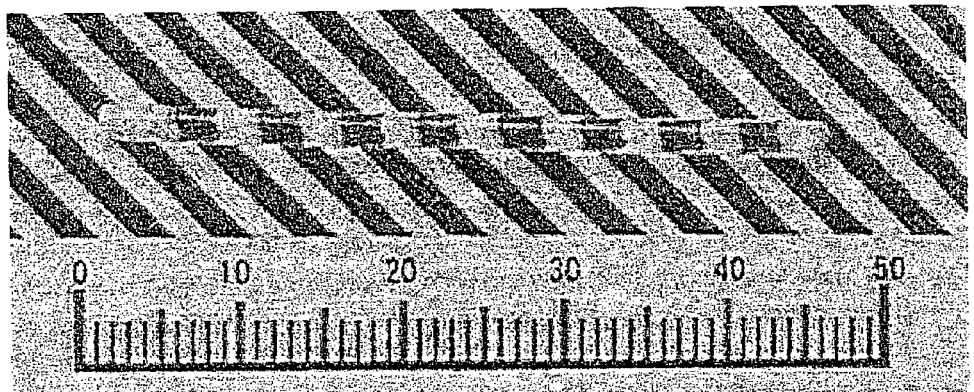
FIG. 6 An exemplary crystal photograph of $M_xRE_yRE'_{1-x-y}F_z$: (M=Sr, RE=Ce, RE'=Gd, x<0.15) according to the present invention.
Figure 7:
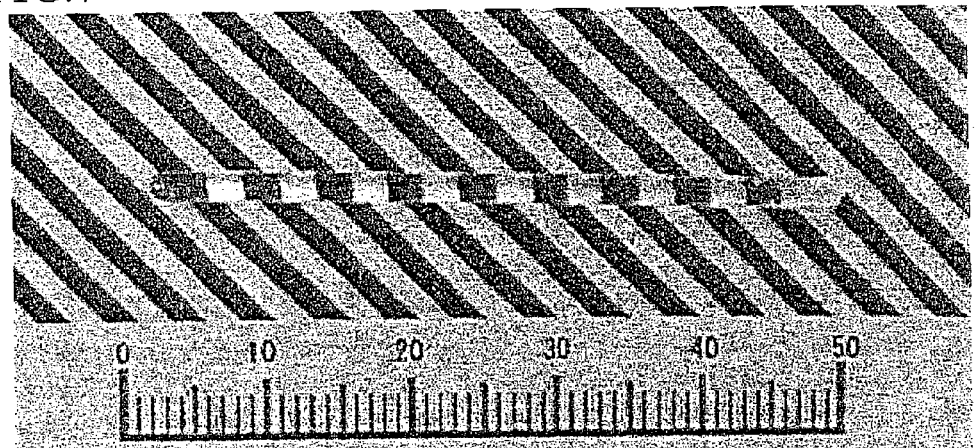
FIG. 7 A crystal photograph of $M_xRE_yRE'_{1-x-y}F_z$: (M=Ba, RE=Ce, RE'=Gd, x>0.15) prepared as a Comparative Example.

Photographs of obtained crystal are shown in FIG. 5 to FIG. 7, which were all colorless and transparent. FIG. 5 shows a solid solution where Gd and Y are included as RE', and its composition is $Sr_{0.001}Ce_{0.02}Y_{0.529}Gd_{0.45}F_{2.99}$. In FIG. 6, x<0.15 similarly to FIG. 5, but only Gd is adopted as RE' so as to have a composition of $Sr_{0.001}Ce_{0.15}Gd_{0.78}F_{2.93}$.

Meanwhile, FIG. 7 shows a crystal as a comparative example where x>0.15, and its composition is $Sr_{0.16}Ce_{0.01}Gd_{0.83}F_{2.84}$.

Figure 8:
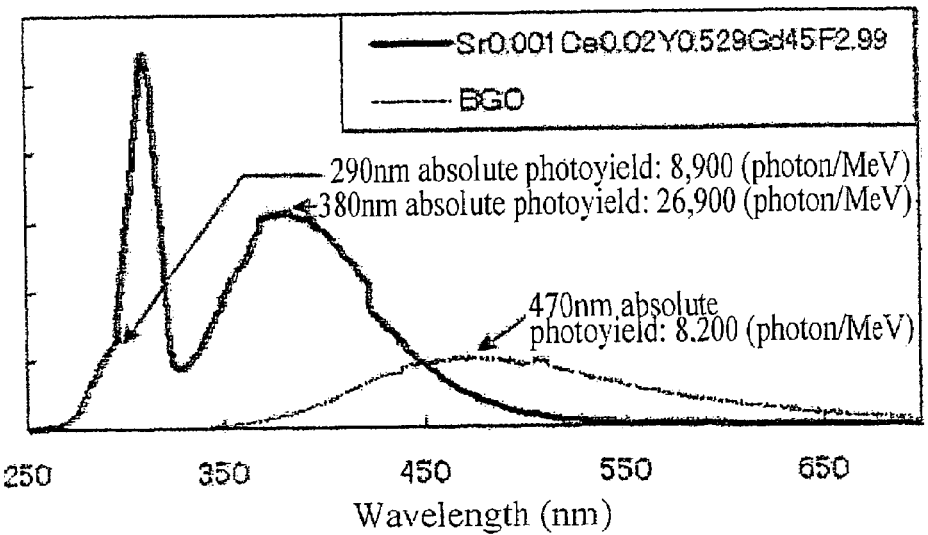
FIG. 8 A result of emission characteristics of an $Sr_{0.001}Ce_{0.02}Y_{0.529}Gd_{0.45}F_{2.99}$ crystal and a BGO crystal, measured by radioluminescence.
Figure 9:
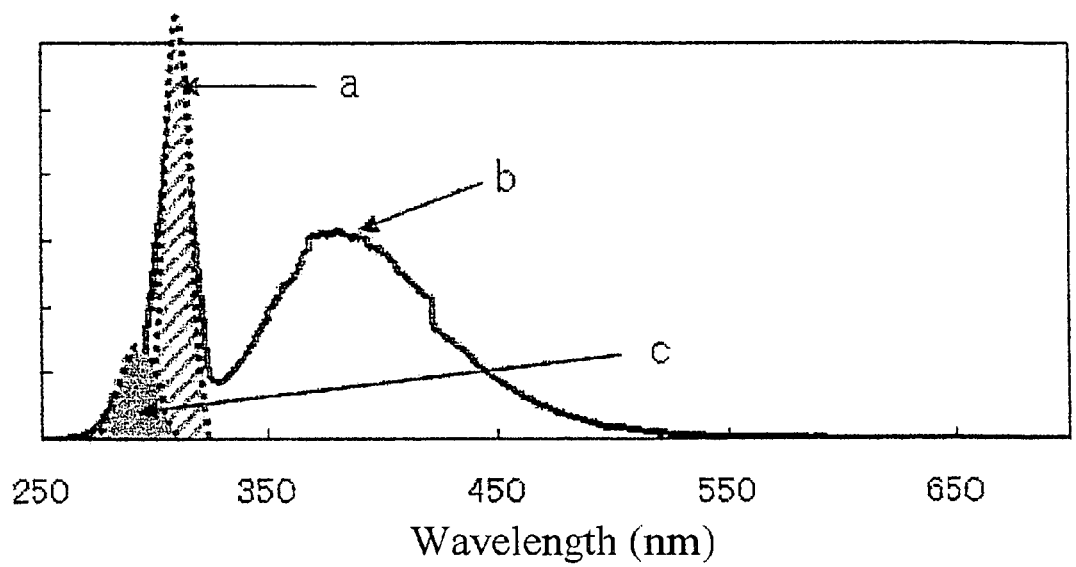
FIG. 9 An explanatory view of emission components of the $Sr_{0.001}Ce_{0.02}Y_{0.529}Gd_{0.45}F_{2.99}$ crystal measured by radioluminescence.
Figure 10:
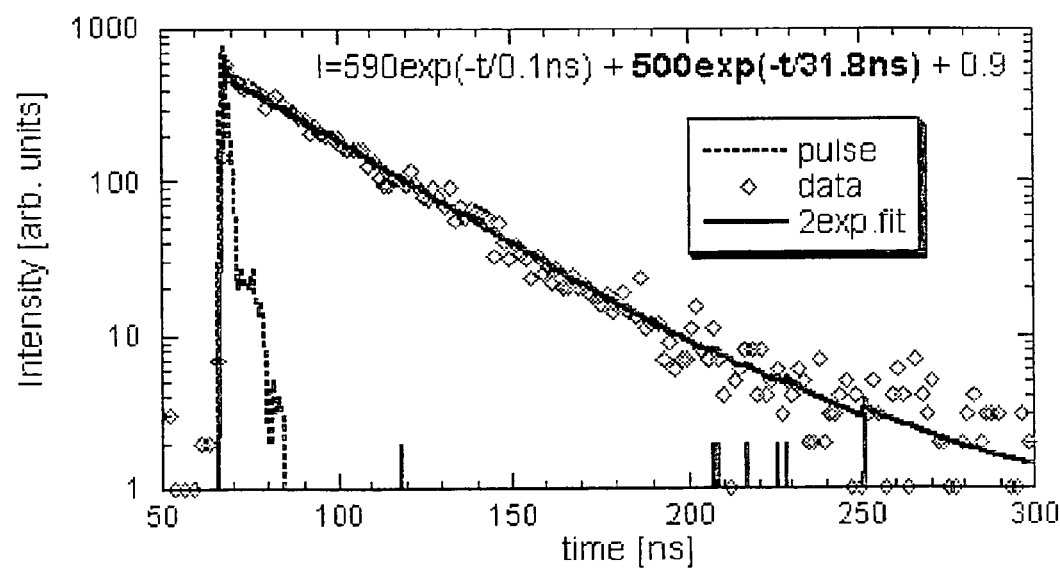
FIG. 10 A result of a fluorescence decay time of the $Sr_{0.001}Ce_{0.02}Y_{0.529}Gd_{0.45}F_{2.99}$ crystal at 380 nm, measured by photoluminescence.
Figure 11:
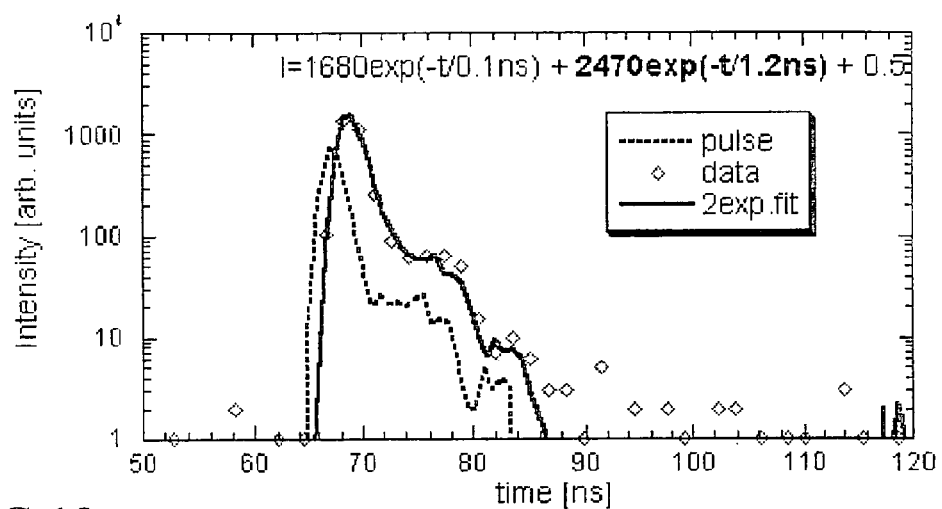
FIG. 11 A result of a fluorescence decay time of the $Sr_{0.001}Ce_{0.02}Y_{0.529}Gd_{0.45}F_{2.99}$ crystal at 290 nm, measured by photoluminescence.
Figure 12:
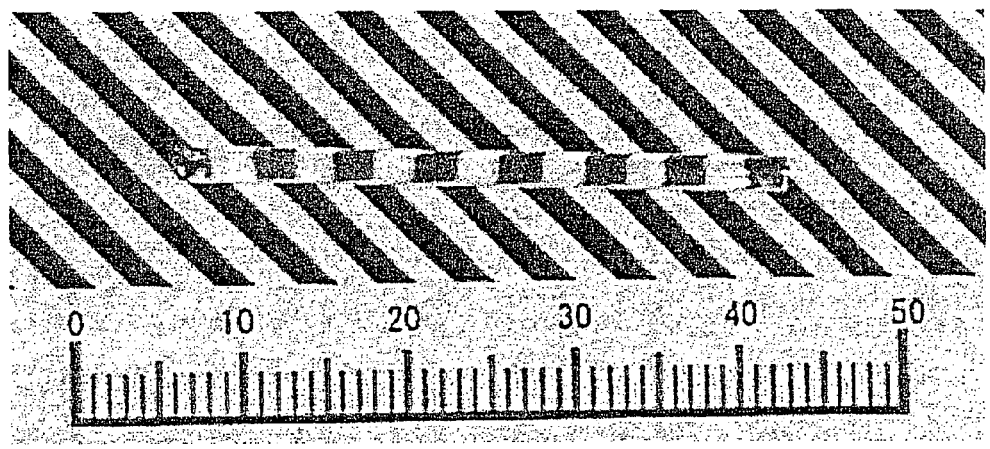
FIG. 12 An exemplary crystal photograph of $M_xRE_yRE'_{1-x-y}F_z$: (M=Sr, RE=Ce, RE'=Gd, x=0.03, y=0.94) according to the present invention.
Figure 13:
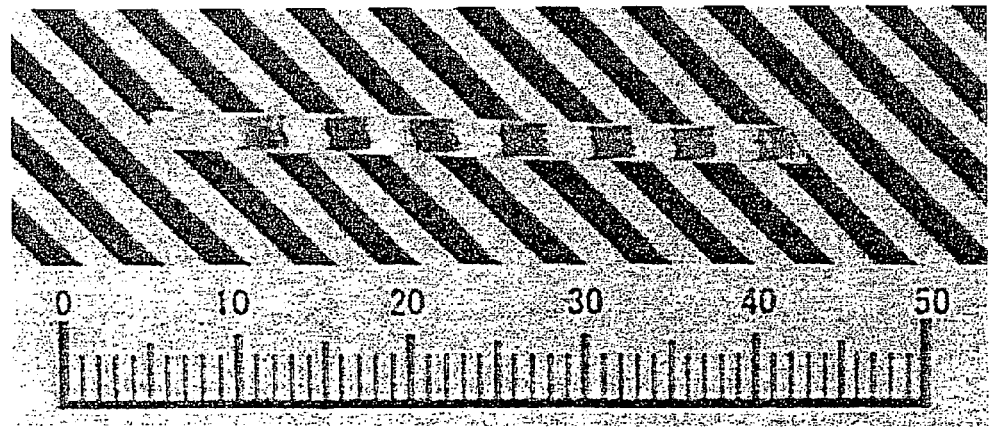
FIG. 13 An exemplary crystal photograph of $M_xRE_yRE'_{1-x-y}F_z$: (M=Sr, RE=Ce, RE'=Gd, x=0.05, y=0.50) according to the present invention.
Figure 14:
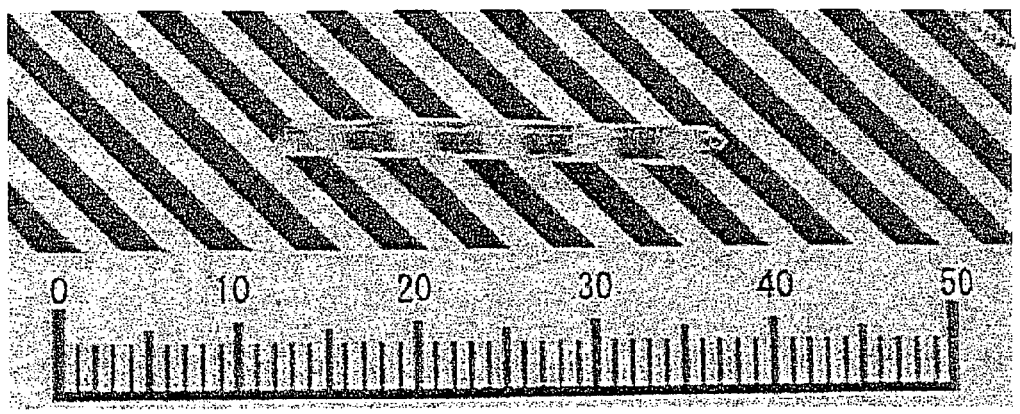
FIG. 14 An exemplary crystal photograph of $M_xRE_yRE'_{1-x-y}F_z$: (M=Sr, RE=Ce, RE'=Gd, x=0.07, y=0.03) according to the present invention.
Figure 15:
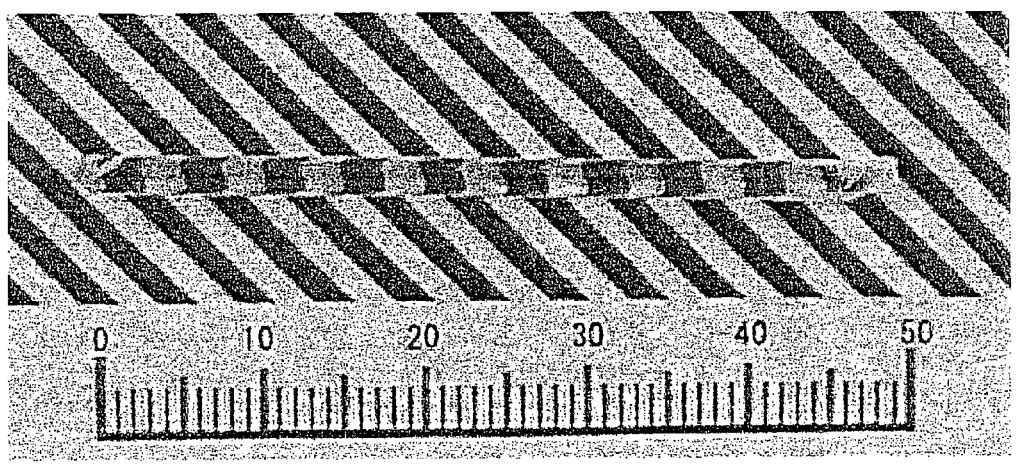
FIG. 15 An exemplary crystal photograph of $M_xRE_yRE'_{1-x-y}F_z$: (M=Sr, RE=Ce, RE'=Gd, x=0.10, y=0.15) according to the present invention.

FIG. 8 shows a result where emission characteristics of $Sr_{0.001}Ce_{0.02}Y_{0.529}Gd_{0.45}F_{2.99}$ and BGO were measured by radioluminescence, and FIG. 9 is an explanatory view of respective emission components in $Sr_{0.001}Ce_{0.02}Y_{0.529}Gd_{0.45}F_{2.99}$. Further, FIG. 10 and FIG. 11 show results where fluorescence decay times at 380 nm and 290 nm were measured by photoluminescence, respectively.

From these results, emission near 400 nm exhibited an extremely high absolute photoyield, and its absolute photoyield ratio was 3.2 relative to BGO (470 nm). Further, the crystal had a fluorescence decay time of 31.8 nsec near 400 nm as compared with 300 nsec of BGO. Namely, it has achieved <50 nsec, thereby proving that it is extremely excellent as a scintillator material.

Further, the crystal has an absolute photoyield ratio of 1.1 near 290 nm relative to BGO (470 nm) to thereby achieve a high absolute photoyield ratio at the same level as BGO (470 nm), while the crystal has a fluorescence decay time threat of 1.2 nsec to thereby attain <2 nsec. Thus, it has a short fluorescence lifetime comparable to that of $BaF_2$. Moreover, the crystal can be regarded as an extremely excellent scintillator material having an ultrashort fluorescence lifetime and a candidate material for a crystal material for a TOF type of PET, in consideration that the crystal has an emission amount which is several times that of $BaF_2$.

The absolute photoyield ratio of $Sr_{0.07}Ce_{0.15}Gd_{0.78}F_{2.93}$ per unit time was 7.3 relative to BGO (470 nm)

Meanwhile, the crystal of $Sr_{0.16}Ce_{0.01}Gd_{0.83}F_{2.84}$ as a comparative example where x>0.15 had an absolute photoyield ratio of 0.06 relative to BGO (470 nm), thereby exhibiting an extremely low value. Thus, this composition is unsuitable for a scintillator material. Note that the same result has also been shown for x>0.15, in "Nuclear Instruments and Methods in Physics Research" A421 (1999) 199-210.

Concerning $Sr_{0.03}Ce_{0.94}Gd_{0.03}F_{2.97}$, $Sr_{0.05}Ce_{0.50}Gd_{0.45}F_{2.95}$, $Sr_{0.07}Ce_{0.03}Gd_{0.90}F_{2.93}$, and $Sr_{0.13}Ce_{0.15}Gd_{0.75}F_{2.90}$, absolute photoyield ratios thereof near 400 nm were 3.2, 5.5, 2.8, and 1.2, respectively, relative to BGO (470 nm), and fluorescence lifetimes were all 30 nsec or shorter.

From the above, this Example is a fluoride scintillator material having a performance superior to that of BGO, and physical properties equivalent to or superior to those of GSO. Further, this Example allows usage of an inexpensive carbon crucible and has a low melting point, in a manner to exemplarily decrease an electric-power amount upon single crystal growth, thereby leading to a decreased production cost.

INDUSTRIAL APPLICABILITY

According to the present invention, it becomes possible to grow rare earth fluoride solid solution single crystals, and to utilize the same as a scintillator, a solid-state laser material, and the like. Further, according to the present invention, there have been found out fluoride scintillator crystals each having a performance exceeding BGO and physical properties equivalent to or superior to those of GSO. Further, the crystals each have a lower boiling point (~1,350° C.), thereby allowing expectation of decreased electric-power amount, decreased cooling water amount, and the like for production of the crystals. Moreover, although Pt, Ir, and the like are each usable as a crucible material, it is also possible to use a carbon crucible which is inexpensive as compared with them, thereby also leading to a decreased production cost.

The invention claimed is:

1. A rare earth fluoride solid solution single crystal wherein said rare earth fluoride solid solution single crystal is represented by $M_xRE_yRE'_{1-x-y}F_z$,
   where RE is one or two or more selected from the group consisting of Ce, Pr, Nd, Eu, Tb, Ho, Er, Tm, and Yb,
   RE' is one or two or more selected from the group consisting of La, Sm, Gd, Dy, Lu, Y, and Sc,
   M is one or more of Mg, Ca, Sr, and Ba,
   $0.0000 < y < 1.0000$,
   $1.5000 \leq z \leq 3.5000$, and
   $0.0000 < x < 0.1500$.

2. The rare earth fluoride solid solution single crystal of claim 1, wherein said rare earth fluoride solid solution single crystal has an absolute photoyield ratio between 1 inclusive and 25 exclusive, relative to BGO.

3. The rare earth fluoride solid solution single crystal of claim 1, wherein said rare earth fluoride solid solution single crystal is a scintillator material where M is Sr.

4. A rare earth fluoride solid solution single crystal wherein said rare earth fluoride solid solution single crystal is a rare earth fluoride solid solution material comprising a plurality of mutually combined rare earth fluorides having different ion radii, respectively;
   wherein said rare earth fluoride solid solution material includes cations having an averaged ion radius which is in a size equal to or less than an ion radius of $La^{3+}$ and larger than an ion radius of $Sm^{3+}$, or in a size smaller than an ion radius of $Gd^{3+}$ and larger than an ion radius of $Er^{3+}$;
   wherein said rare earth fluoride solid solution material includes Ce, and is free of primary phase transitions over a temperature range from room temperature to a melting point of said rare earth fluoride solid solution; and
   wherein said rare earth fluoride solid solution single crystal includes an alkaline earth metal (AE) which is one or more of Mg, Ca, Sr, and Ba.

5. The rare earth fluoride solid solution single crystal of claim 4, wherein the content of the alkaline earth metal is 0.0010 to 15.0000 (wt %).

6. A rare earth fluoride solid solution single crystal wherein said rare earth fluoride solid solution single crystal is a rare earth fluoride solid solution material comprising a plurality of mutually combined rare earth fluorides having different ion radii, respectively;
   wherein said rare earth fluoride solid solution material includes cations having an averaged ion radius which is in a size equal to or less than an ion radius of $La^{3+}$ and larger than an ion radius of $Sm^{3+}$, or in a size smaller than an ion radius of $Gd^{3+}$ and larger than an ion radius of $Er^{3+}$;
   wherein said rare earth fluoride solid solution material includes Ce, and is free of primary phase transitions over a temperature range from room temperature to a melting point of said rare earth fluoride solid solution; and
   wherein said rare earth fluoride solid solution material has fluorescence components at least one of which has a decay time of 50 nsec or shorter at a room temperature.

7. The rare earth fluoride solid solution single crystal of claim 6, wherein the content of Ce is 0.0010 to 10.0000 (wt %).

8. The rare earth fluoride solid solution single crystal of claim 6, wherein said rare earth fluoride solid solution single crystal has an absolute photoyield ratio between 1 inclusive and 25 exclusive, relative to $Bi_4Ge_3O_{12}$ (BGO).

9. The rare earth fluoride solid solution single crystal of claim 6, wherein an oxygen concentration is less than 10,000 wtppm.

10. The rare earth fluoride solid solution single crystal of claim 9, wherein an oxygen concentration is less than 100 wtppm.

11. A radiation detector wherein said radiation detector is provided by mutually combining:
    a scintillator comprising the rare earth fluoride solid solution single crystal of claim 6; and
    optical response means (photomultiplier tube (PMT), position sensitive photomultiplier tube (PSPMT), photodiode (PD), avalanche photodiode (APD), or the like).

12. A radiographic inspection apparatus wherein said radiographic inspection apparatus is provided with the radiation detector of claim 11 as a radiation detector.

13. The radiographic inspection apparatus of claim 12, wherein said rare earth fluoride solid solution single crystal has fluorescence components at least one of which has a decay time of 2 nsec or shorter at room temperature.

14. The radiographic inspection apparatus of claim 13, wherein said radiographic inspection apparatus is a type of simplex form, or a type combined with either or both of MRI and CT.

15. The radiographic inspection apparatus of claim 13 for a medical image processor, wherein said radiographic inspection apparatus is a type of simplex form, or a type combined with a magnetic resonance imaging (MRI), computed tomography (CT), single photon emission computed tomography (SPECT) apparatus, or a gamma camera, or any combination thereof.

16. The radiographic inspection apparatus of claim 13, wherein said radiographic inspection apparatus is a positron emission tomography PET apparatus.

17. The radiographic inspection apparatus of claim 16, wherein said PET is a two-dimensional PET, a three-dimensional PET, a time of flight (TOF) type PET, a depth of interaction (DOI) type PET, or any combination thereof.

18. The radiographic inspection apparatus of claim 17, wherein said TOF type PET is combined with a position sensitive photomultiplier tube.

19. A rare earth fluoride solid solution single crystal wherein said rare earth fluoride solid solution single crystal is represented by $(RE_y RE'_{1-y})F_3$ (0.2<y<0.9), wherein RE represents one or two or more selected from the group consisting of Sm, Eu, and Gd, and RE' represents one or two or more selected from the group consisting of Er, Tm, Yb, Lu, and Y, except for $Gd_y Y_{1-y} F_3$, $Gd_y Er_{1-y} F_3$, and $Gd_y(YEr)_{1-y} F_3$); and
  wherein the solid solution material of rare earth element fluoride is free of primary phase transitions over a temperature range from room temperature to a melting point of said rare earth fluoride solid solution; and
  wherein said rare earth fluoride solid solution material has fluorescence components at least one of which has a decay time of 50 nsec or shorter at a room temperature.

20. The rare earth fluoride solid solution single crystal of claim 19, wherein said rare earth fluoride solid solution single crystal includes Ce.

21. A rare earth fluoride solid solution single crystal wherein said rare earth fluoride solid solution single crystal is represented by $(RE_y RE'_{1-y})F_3$ (0.0000<y<1.0000), where RE represents one or two or more selected from the group consisting of Sm, Eu, and Gd, and RE' represents one or two or more selected from the group consisting of Er, Tm, Yb, Lu, and Y;
  wherein said rare earth fluoride solid solution single crystal includes Ce, and is free of primary phase transitions over a temperature range from room temperature to a melting point of said rare earth fluoride solid solution; and
  wherein said rare earth fluoride solid solution material has fluorescence components at least one of which has a decay time of 50 nsec or shorter at a room temperature.

22. The rare earth fluoride solid solution single crystal of claim 21, wherein 0.2000≦y≦0.9000.

23. The rare earth fluoride solid solution single crystal of claim 22, wherein 0.6≦y≦0.8.

24. The rare earth fluoride solid solution single crystal of claim 21, wherein said rare earth fluoride solid solution single crystal is a scintillator material where RE is Gd, and RE' is either or both of Lu and Y.

25. The rare earth fluoride solid solution single crystal of claim 24, wherein said rare earth fluoride solid solution single crystal is a scintillator material where RE is Ce.

26. A rare earth fluoride solid solution single crystal, wherein said rare earth fluoride solid solution single crystal is a single crystal and is represented by $Gd_y Y_{1-y} F_3$, $Gd_y Er_{1-y} F_3$, or $Gd_y(YEr)_{1-y} F_3$) 0.4≦y<0.6); and
  wherein said rare earth fluoride solid solution single crystal includes Ce, and is free of primary phase transitions over a temperature range from room temperature to a melting point of said rare earth fluoride solid solution.

27. The rare earth fluoride solid solution single crystal of claim 26, wherein said single crystal is grown by any one of a micro-pulling-down method, Czochralski method, Bridgman method, zone melt method, and Edge-defined Film-fed Growth Method (EFG method).

* * * * *